United States Patent
Sankarapandian et al.

(10) Patent No.: US 10,049,876 B1
(45) Date of Patent: Aug. 14, 2018

(54) REMOVAL OF TRILAYER RESIST WITHOUT DAMAGE TO UNDERLYING STRUCTURE

(71) Applicant: INTERNATIONAL BUSINESS MACHINES CORPORATION, Armonk, NY (US)

(72) Inventors: Muthumanickam Sankarapandian, Niskayuna, NY (US); Soon-Cheon Seo, Glenmont, NY (US); Indira P. Seshadri, Troy, NY (US); John R. Sporre, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/430,984

(22) Filed: Feb. 13, 2017

(51) Int. Cl.
  *H01L 21/033* (2006.01)
  *H01L 21/311* (2006.01)
  *H01L 21/027* (2006.01)
  *H01L 21/3105* (2006.01)
  *H01L 21/8238* (2006.01)

(52) U.S. Cl.
  CPC ...... *H01L 21/0332* (2013.01); *H01L 21/0276* (2013.01); *H01L 21/31051* (2013.01); *H01L 21/31116* (2013.01); *H01L 21/31138* (2013.01); *H01L 21/31144* (2013.01); *H01L 21/823864* (2013.01)

(58) Field of Classification Search
  CPC ......... H01L 21/0332; H01L 21/823864; H01L 21/31051; H01L 21/0276; H01L 21/31144; H01L 21/31138; H01L 21/31116
  See application file for complete search history.

(56) References Cited

U.S. PATENT DOCUMENTS

| | | | |
|---|---|---|---|
| 7,811,926 | B2 | 10/2010 | Fuller et al. |
| 2006/0102208 | A1 | 5/2006 | Jacobson et al. |
| 2007/0161226 | A1 | 7/2007 | Dalton et al. |
| 2008/0311744 | A1 | 12/2008 | Fuller et al. |
| 2011/0076623 | A1 | 3/2011 | Fitrianto |
| 2011/0101507 | A1 | 5/2011 | Yusuff et al. |
| 2013/0087767 | A1 | 4/2013 | Chang et al. |

(Continued)

OTHER PUBLICATIONS

Disclosed Anonymously "Method to Enable Complete Wets Removal of Si HM Materials without Residue Using Mild Wets Chemistries" IP.com No. IPCOM000242486D (Jul. 2015) pp. 1-4.

(Continued)

*Primary Examiner* — Duy Deo
*Assistant Examiner* — Mahmoud Dahimene
(74) *Attorney, Agent, or Firm* — Tutunjian & Bitetto, P.C.; Vazken Alexanian (57) ABSTRACT

A method for semiconductor processing includes forming a trilayer resist structure having a middle layer disposed between a top layer and a bottom layer. The top layer is removed from a first region to expose the middle layer in the first region, and the middle layer and the bottom layer are removed in the first region to expose a structure to be processed. The top layer in a second region is also removed with the bottom layer in the first region. The first region is filled to protect the structure in the first region. The middle layer is removed in the second region while the first region remains protected. The structures in the first region and structures in the second region are exposed.

20 Claims, 10 Drawing Sheets

(56) References Cited

U.S. PATENT DOCUMENTS

| | | |
|---|---|---|
| 2013/0089956 A1* | 4/2013 | Chang .................. H01L 29/775 438/151 |
| 2014/0186774 A1 | 7/2014 | Glodde et al. |
| 2014/0187047 A1 | 7/2014 | Tagami et al. |
| 2014/0273501 A1 | 9/2014 | Glodde et al. |
| 2015/0187596 A1 | 7/2015 | Nowling et al. |
| 2015/0318180 A1 | 11/2015 | Rim et al. |
| 2015/0325450 A1 | 11/2015 | Abdallah et al. |

OTHER PUBLICATIONS

Disclosed Anonymously "Defect Reduction Method for Tri-layer Integration" IP.com No. IPCOM000182345D (Apr. 2009) pp. 1-7.

Disclosed Anonymously "A Novel Method to Remove Non-metallic Hardmask for RMG WFM Patterning Process" IP.com No. IPCOM000240429D (Jan. 2015) pp. 1-3.

Mattson, D. et al., "Dry Strip Removal of Si-Containing Anti-Reflective Coating Photo Resist Stacks" ECS Transactions (Aug. 2011) pp. 263-268, vol. 41, No. 5.

Wei, Y. et al., "Performance of tri-layer process required for 22nm and beyond" Proc. of SPIE Advances in Resist Materials and Processing Technology XXVIII (Apr. 2011) pp. 79722L-1-79722L-12, vol. 7972.

* cited by examiner

REMOVAL OF TRILAYER RESIST WITHOUT DAMAGE TO UNDERLYING STRUCTURE

BACKGROUND

Technical Field

The present invention generally relates to semiconductor processing, and more particularly to methods and devices that can remove a middle layer in a trilayer photoresist without damage to exposed device structures.

Description of the Related Art

Semiconductor patterning often employs photoresists for creating detailed masks for processing semiconductor structures. In some instances, multiple photoresist layers are employed to process different areas of a chip or wafer using different portions of the multilayered structure. In one example, patterning schemes with photoresists can be employed to form critical dimension (CD) features, e.g., sources/drains, fins, gates, contacts, back end of the line (BEOL) metal layers, etc.

SUMMARY

In accordance with an embodiment of the present invention, a method for semiconductor processing includes forming a trilayer resist structure having a middle layer disposed between a top layer and a bottom layer. The top layer is removed from a first region to expose the middle layer in the first region, and the middle layer and the bottom layer are removed in the first region to expose a structure to be processed. The top layer in a second region is also removed with the bottom layer in the first region. The first region is filled to protect the structure in the first region. The middle layer is removed in the second region while the first region remains protected. The structures in the first region and structures in the second region are exposed.

Another method for semiconductor processing includes forming a trilayer resist structure having a middle layer disposed between a top layer and a bottom layer; removing the top layer from a first region to expose the middle layer in the first region; removing the middle layer and the bottom layer in the first region, to expose a structure to be protected, the top layer in a second region also being removed with the bottom layer in the first region; processing the structure to be protected in the first region; forming a planarization layer over the middle layer in the second region and the structure to be protected in the first region; removing the planarization layer down to the middle layer in the second region and to a position over the structure to be protected in the first region; removing the middle layer in the second region while the first region remains protected by the planarization layer; and stripping the planarization layer in the first region and the bottom layer in the second region to expose the structure to be protected in the first and second regions.

Yet another method for semiconductor processing includes forming a trilayer resist structure having a middle layer disposed between a top layer and a bottom layer; removing the top layer from a first region to expose the middle layer in the first region; removing the middle layer and the bottom layer in the first region, to expose a structure to be protected, the top layer in a second region also being removed with the bottom layer in the first region; processing the structure to be protected in the first region; forming a planarization layer over the middle layer in the second region and the structure to be protected in the first region such that the first region remains protected by the planarization layer; polishing to remove the middle layer in the second region wherein the planarization layer in the first region and the bottom layer in the second region are planarized; and stripping the planarization layer in the first region and the bottom layer in the second region to expose the structure to be protected in the first and second regions.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

In accordance with aspects of the present invention, trilayer photoresist structures and processing methods are provided for processing semiconductor devices. In particularly useful embodiments, the processing methods can be employed in complementary metal oxide semiconductor (CMOS) device processing, especially where NFET and PFET areas of the device are alternately processed.

In accordance with the present embodiments, a trilayer resist (TLR) patterning scheme is provided to enable formation of device dimensions including critical dimension features. The device dimensions can be for structures such as, e.g., source and drain regions, fins, gates, contacts, back end of the line (BEOL) metal layers, etc. especially with critical dimensions (CDs) of less than, e.g., 40 nm and with minimal line edge roughness (LER) and minimal line width roughness (LWR).

In one embodiment, the TLR patterning scheme utilizes an organic/inorganic/organic multilayer stack instead of just an organic layer. A top organic layer photoresist material can be of a type suitable for deep ultraviolet (DUV), extreme UV (EUV), X-ray, or e-beam lithography that can be located atop an antireflective coating (ARC), which is also comprised of an organic material providing high resolution lithography patterning. A middle inorganic layer of the TLR comprises any oxide layer such as, for example, a low temperature (e.g., less than or equal to 250° C.) chemical vapor deposited (CVD) oxide, an oxide derived from TEOS (tetraethylorthosilicate), a silicon oxide, a silane oxide, or a Si-containing ARC material (SiARC).

The middle inorganic layer includes a patterning hard mask for retaining CD and vertical profile during organic planarization layer (OPL) etching (e.g., by reactive ion etching (RIE)) of a bottom organic layer. The bottom organic layer of the TLR (e.g., OPL) can include any spin-on organic layer such as, for example, a Near Frictionless Carbon (NFC), a diamond-like carbon, a thermosetting polyarylene ether, or a polyimide.

The trilayer structure is employed and processed to protect different structures during the back and forth of CMOS processing (e.g., between alternate NFET and PFET processing in different areas of a chip or wafer).

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 1:
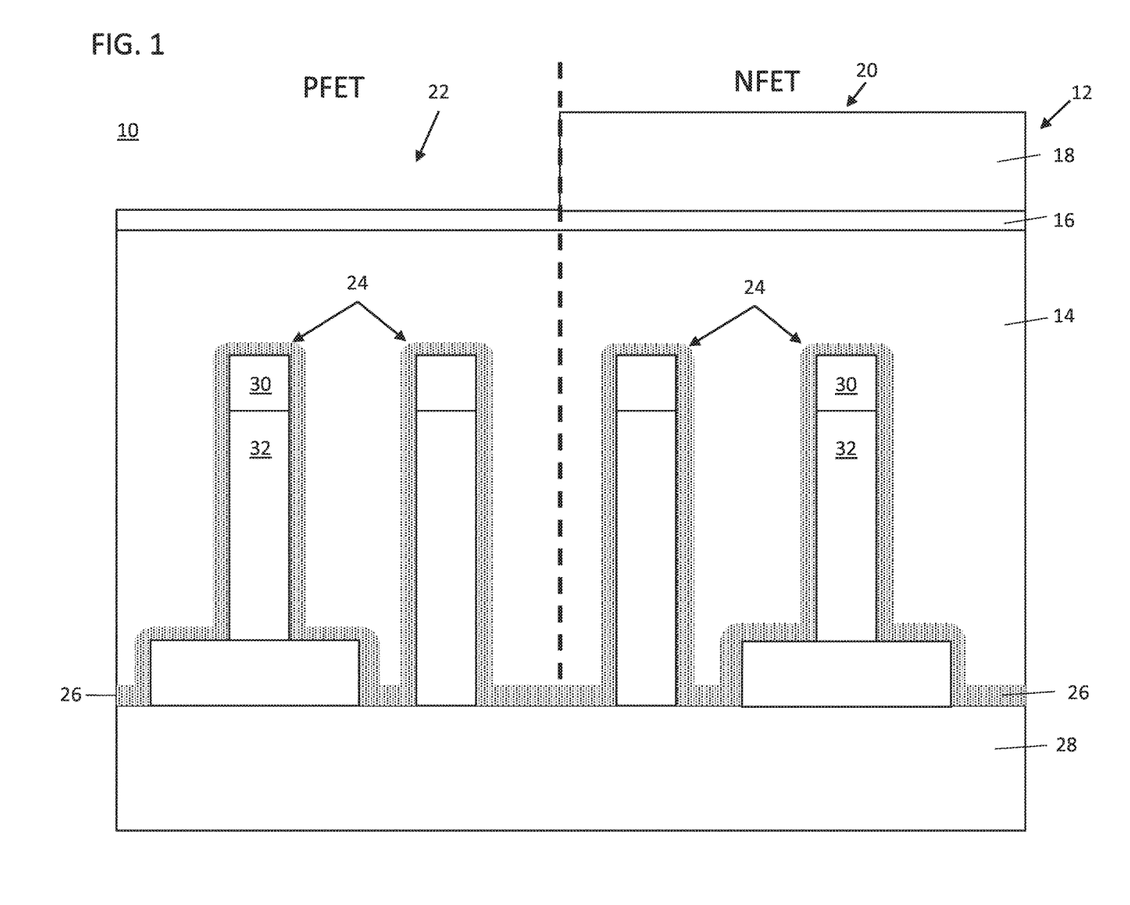
FIG. 1 is a cross-sectional view illustratively showing an n-type field effect transistor (NFET) region and a p-type field effect transistor (PFET) region on a semiconductor device where the PFET region has a top layer of a trilayer structure removed in accordance with an embodiment of the present invention.

Referring now to the drawings in which like numerals represent the same or similar elements and initially to FIG. 1, in accordance with one embodiment, a semiconductor device 10 is illustratively shown. Device 10 can include a CMOS device. The CMOS device 10 includes an NFET region 20 and a PFET region 22. The NFET region 20 and PFET region 22 both include gate structures 24 having a protective spacer layer 26 formed thereon. The spacer layer 26 can include a nitride, such as silicon nitride, although other suitable dielectric materials may be employed. The NFET region 20 and PFET region 22 can have any structures formed therein; however, for illustrative purposes the structures 24 include spacer layers 26, hard mask or cap layers 30 and shallow trench isolation (STI) regions 28, which are often subjected to damage by conventional processing. It should be understood that other structures and components can also be employed instead of or in addition to the illustrative structures 24 described.

It should also be understood that the STI regions 28 can be formed on a substrate including one or more layers and materials. In one embodiment, the STI region 28 is formed on a semiconductor substrate, such as, e.g., Si, SiGe, Ge, III-V materials or any other suitable material(s).

The cap layers 30 may be formed over dummy gates or metal gates 32. Other structures can also be employed. The cap layers 30 can include silicon nitride, although other suitable materials may be employed.

In accordance with illustrative embodiments, a trilayer (TLR) resist structure 12 includes a bottom layer 14, a middle layer 16 and a top layer 18 that are formed across the NFET region 20 and the PFET region 22. In one embodiment, the TLR structure 12 utilizes an organic/inorganic/organic multilayer stack. The bottom layer 14 may include an organic planarization layer (OPL). The bottom layer 14 can include a spun-on organic layer such as, for example, a Near Frictionless Carbon (NFC), a diamond-like carbon, a thermosetting polyarylene ether or polyimide.

The middle inorganic layer 16 can include any oxide layer such as, for example, a low temperature (e.g., less than or equal to 250° C.) chemical vapor deposited (CVD) oxide, an oxide derived from TEOS (tetraethylorthosilicate), a silicon oxide, a silane oxide, a Si-containing ARC material (SiARC), etc. The middle inorganic layer 16 can include a patterning hard mask for retaining CDs and vertical profiles during the etching or removal of the underlying bottom layer 14 (e.g., OPL). In one embodiment, the middle inorganic layer 16 is selectively etchable to one or both of the top layer 18 and bottom layer 14.

The top layer resist material 18 can be of a type suitable for deep ultraviolet (DUV), extreme UV (EUV), X-ray, or e-beam lithography. The top layer 18 can include an organic material. In one embodiment, the top layer 18 can be formed on an ARC middle layer 16 (e.g., SiARC), or an additional ARC layer (not shown) (e.g., an organic ARC material) may be formed between the top layer 18 and middle layer 16. The top layer 18 can include an organic material that provides for high resolution lithography patterning.

The trilayer resist (TLR) structure 12 enables the formation of device dimensions including critical dimension features. The device dimensions can be for structures such as, e.g., source and drain regions, fins, gates, contacts, back end of the line (BEOL) metal layers, etc. especially with CDs of less than about, e.g., 40 nm and minimal line edge roughness (LER) and minimal line width roughness (LWR). The trilayer structure 12 is employed and processed to protect different structures during the back and forth of CMOS processing (e.g., between alternate NFET and PFET processing).

After being deposited in both the NFET region 20 and the PFET region 22 of CMOS device 10, FIG. 1 depicts the trilayer structure 12 having the top layer 18 removed from the PFET region 22. This can be achieved by a conventional photolithography process by exposing the resist through a photomask, developing the resist and removing the light-exposed resist of the PFET region 22 while leaving the resist intact in the NFET region 20. This results in the top layer 18 being removed from the PFET region 22 to expose the middle layer 16.

Figure 2:
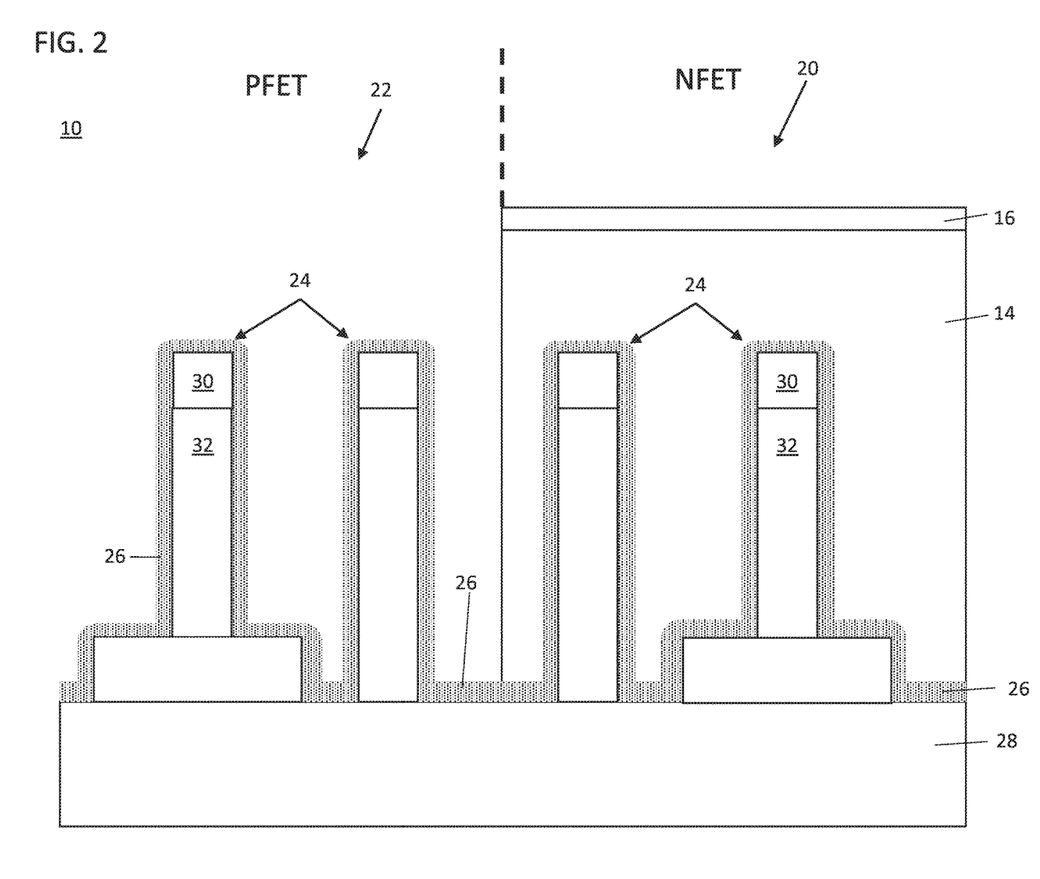
FIG. 2 is a cross-sectional view of the device of FIG. 1 showing a middle layer and a bottom layer removed from the PFET region on the semiconductor device and a top layer in the NFET region removed in accordance with an embodiment of the present invention.

Referring to FIG. 2, a reactive ion etch (RIE) is performed to remove the middle layer 16 and the bottom layer 14 from the PFET regions 22. The RIE also removes the top layer 18 from the NFET region 20, which stops on the middle layer 16. In the illustrative example depicted, the structures 24 are protected by the spacer layer 26.

Figure 3:
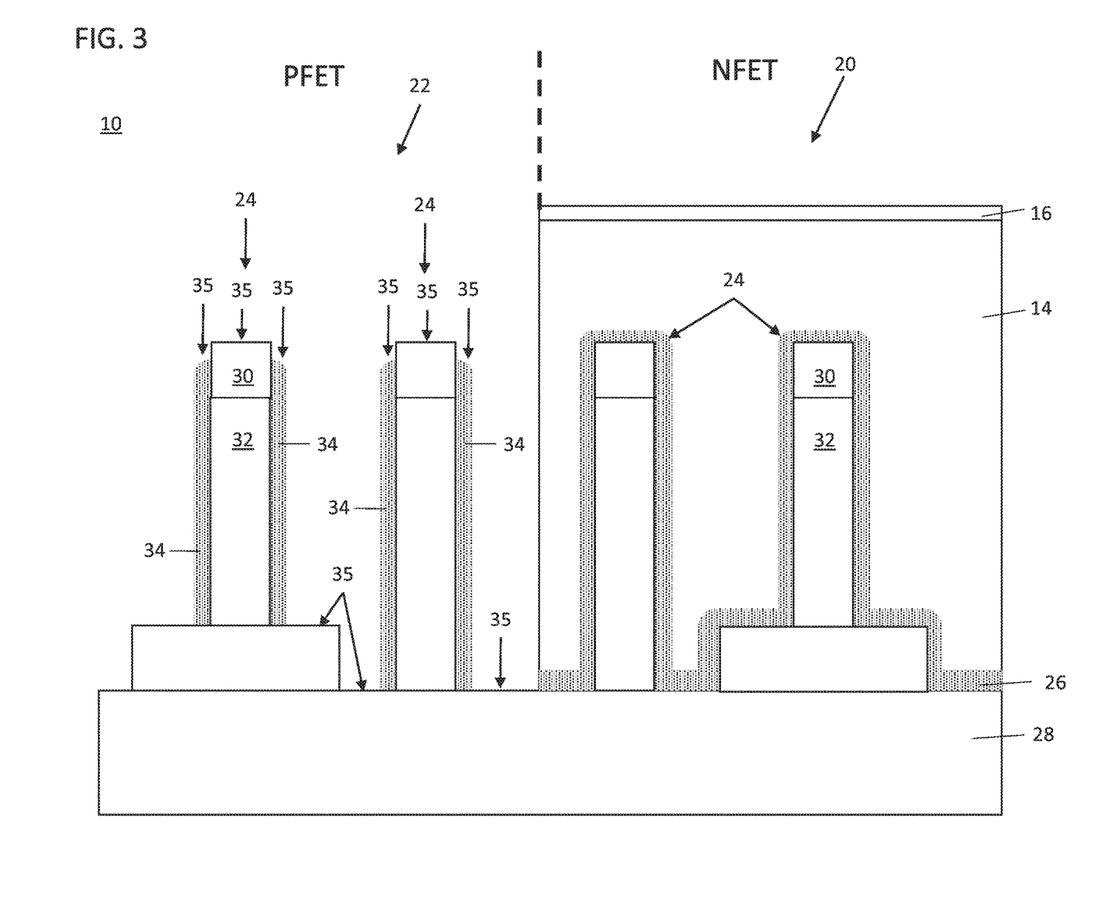
FIG. 3 is a cross-sectional view of the device of FIG. 2 showing underlying structures processed (e.g., a spacer etch, etc.) in the PFET region on the semiconductor device in accordance with an embodiment of the present invention.

Referring to FIG. 3, another RIE process (spacer RIE) is employed to remove the spacer layer 26 from horizontal surfaces. The RIE forms sidewalls spacers 34 on the structures 24. The middle layer 16 on the NFET region 20 protects the bottom layer 14 in the NFET region 20. A portion of the thickness of the middle layer 16 is consumed during the spacer RIE.

To continue processing, the middle layer 16 and/or the bottom layer 14 in the NFET region 20 need to be removed. Due to the etch resistant properties of the middle layer 16 and the depth of the bottom layer 14, etching the middle layer 16 (and/or the bottom layer 14) in the NFET region 20 directly can cause damage to the cap layers (hard mask) 30, the STI regions 28, spacers 34 and other structures as indicated by regions 35. To prevent damage in regions 35, different methods are employed in accordance with aspects of the present invention.

Figure 4:
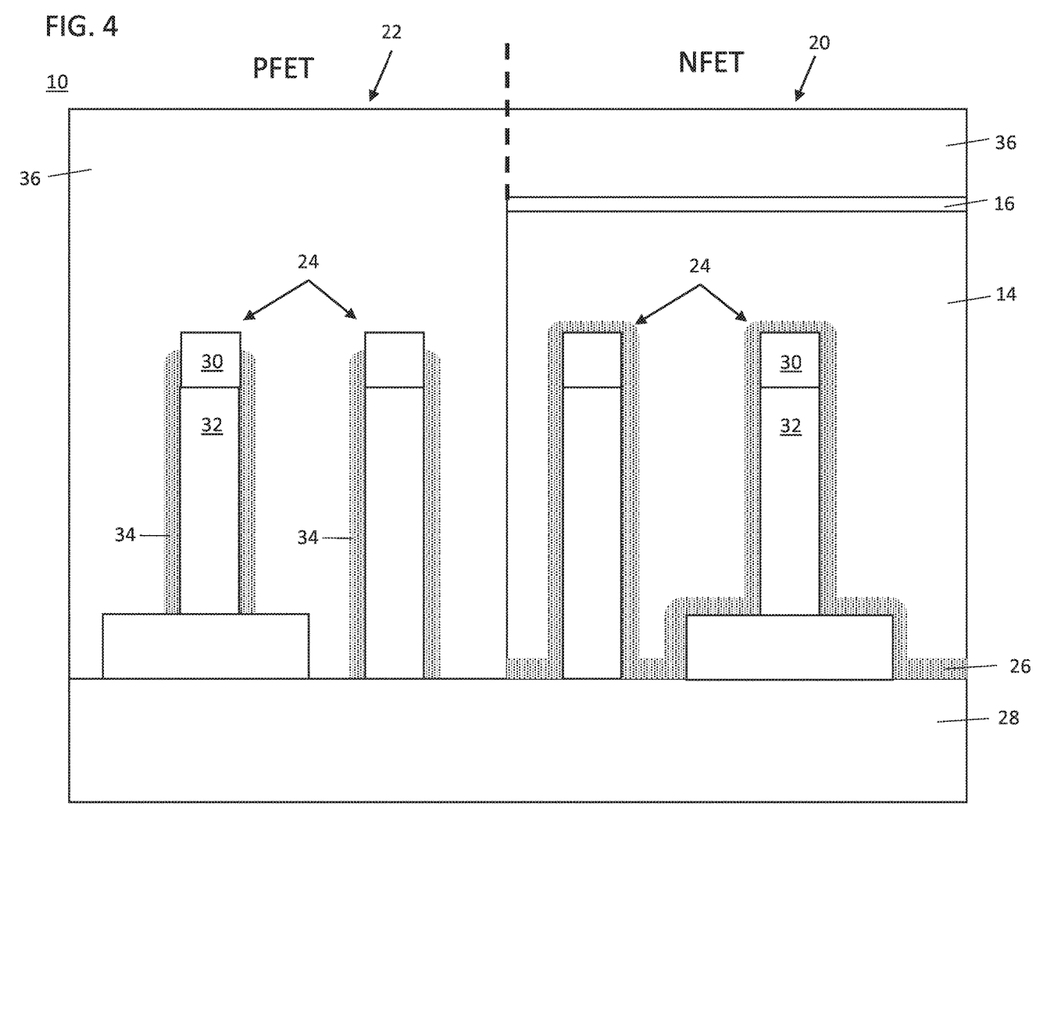
FIG. 4 is a cross-sectional view of the device of FIG. 3 showing a planarization layer formed for protection in the PFET region and on the middle layer in the NFET region in accordance with an embodiment of the present invention.

Referring to FIG. 4, a planarization layer 36 is formed over the middle layer 16 in the NFET region 20 and over the exposed structures 24 in the PFET region 22. The planarization layer 36 can include an OPL, e.g., for bottom layer 14, although any suitable dielectric material can be employed for the planarization layer 36. To achieve a uniform planarity over various pattern densities, chemical-mechanical polish (CMP) can be employed over the top surface.

Figure 5:
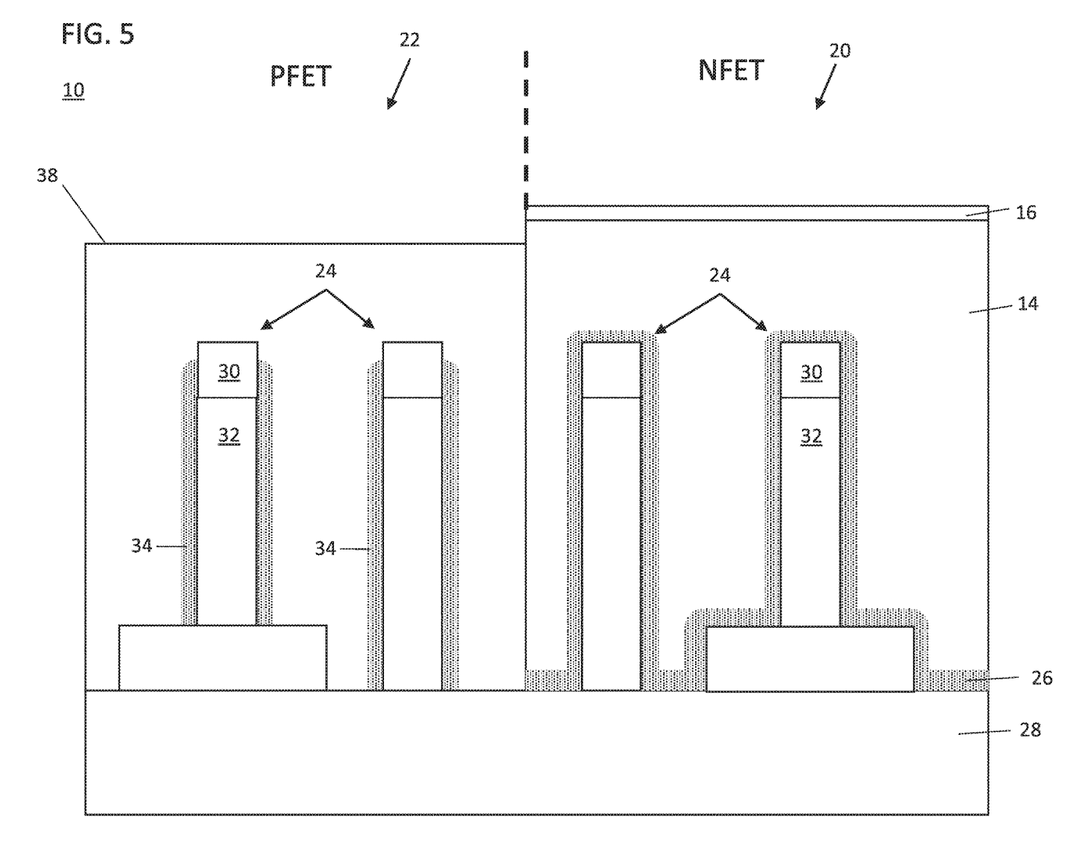
FIG. 5 is a cross-sectional view of the device of FIG. 4 showing the planarization layer etched to below the middle layer in the NFET region in accordance with an embodiment of the present invention.

Referring to FIG. 5, in one embodiment, the planarization layer 36 is etched, to reduce a height of a surface 38 of the planarization layer 36 in the PFET region 22 to below a height of the middle layer 16 in the NFET region 20. The etch can be selective to the planarization layer 36 so that the middle layer 16 remains substantially intact. The height of the surface 38 of the planarization layer 36 can be anywhere between the middle layer 16 and the features to be protected (e.g., cap layer or hard mask 30).

In a particularly useful embodiment, the planarization layer 36 is subjected to a RIE to reveal the middle layer 16 in the NFET region 20. Then, another etch (e.g., RIE or wet etch) is performed to selectively etch the planarization layer 36 to achieve the height on surface 38.

Figure 6:
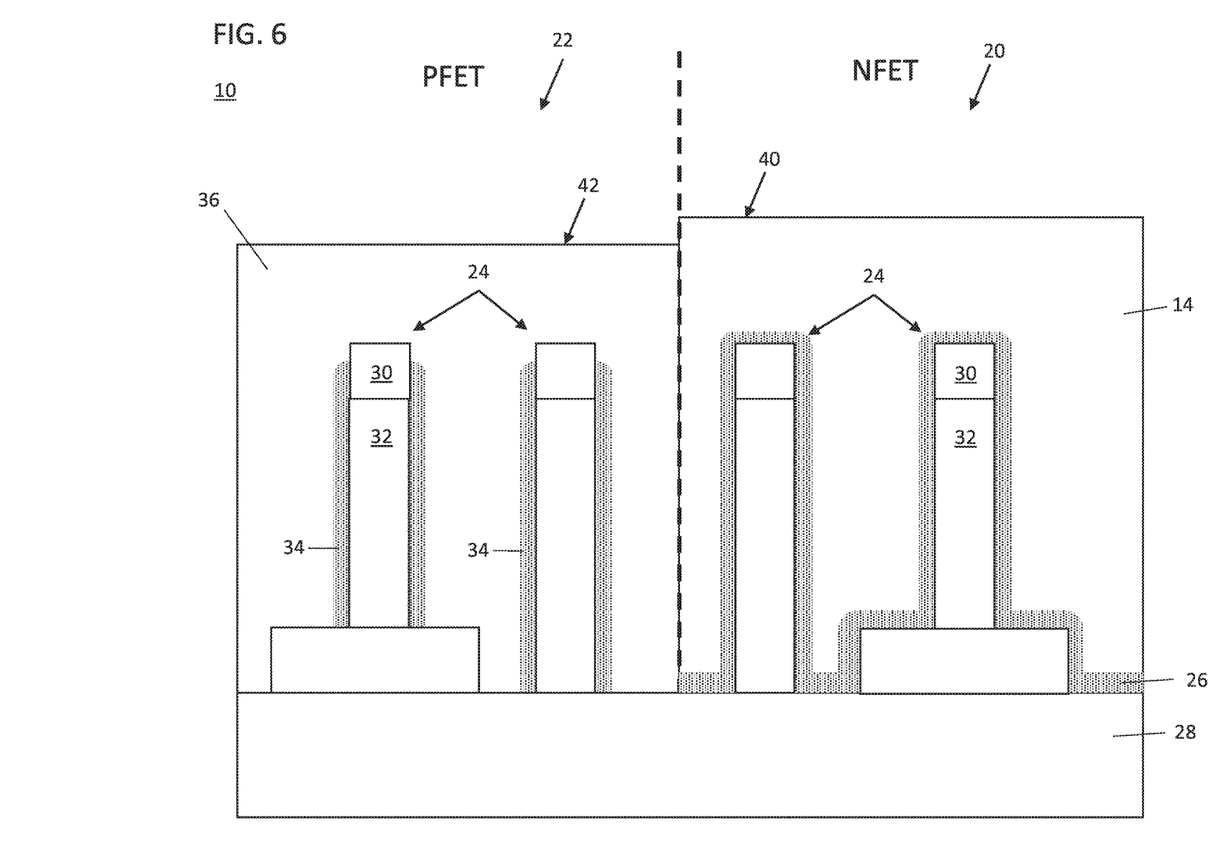
FIG. 6 is a cross-sectional view of the device of FIG. 5 showing the middle layer in the NFET region removed in accordance with an embodiment of the present invention.

Referring to FIG. 6, the middle layer 16 is removed from the NFET region 20 by a selective etch process (e.g., selective to the material of layer 36 and/or layer 14). Any suitable etch process may be employed. In one embodiment, the materials for the bottom layer 14 and the planarization layer 36 are the same. In other embodiments, the materials for the bottom layer 14 and the planarization layer 36 are different. In one particularly useful embodiment, a height of a surface 40 of the bottom layer 14 exceeds a height of a surface 42 of the planarization layer 36. In other embodiments, the materials of the bottom layer 14 and the planarization layer 36 can be selected to provide a desired amount of protection to regions 20 and 22. For example, one of the bottom layer 14 or the planarization layer 36 may be completely removed before the other based upon the materials and heights of the layers 14 and 36.

Figure 7:
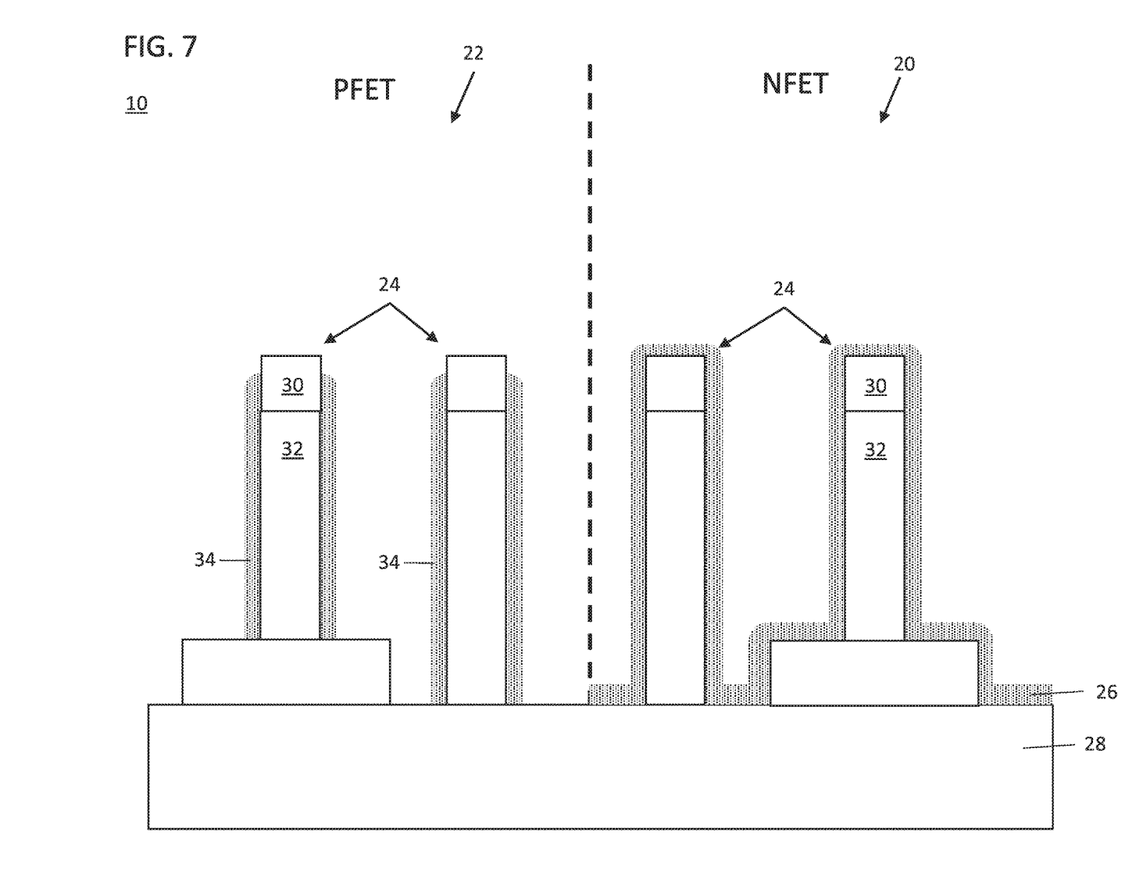
FIG. 7 is a cross-sectional view of the device of FIG. 6 showing the planarization layer and the bottom layer stripped to expose the underlying structures in accordance with an embodiment of the present invention.

Referring to FIG. 7, the bottom layer 14 of the NFET region 20 and the planarization layer 36 in the PFET region 22 are stripped to expose the underlying structures 24. The underlying structures (e.g., structures 24, STI region 28, etc.) remain intact and virtually undamaged as a result of the use of the planarization layer 36 and processing sequence. Processing can continue with blocking the PFET region 22 and performing a spacer etch in the NFET region 20.

It should be understood that the NFET and the PFET regions described may be reversed and processed in a similar manner. In other embodiments, the alternatively processed regions may include regions other than NFET and PFET regions.

In another method, processing begins with the structure of FIG. 5.

Figure 8:
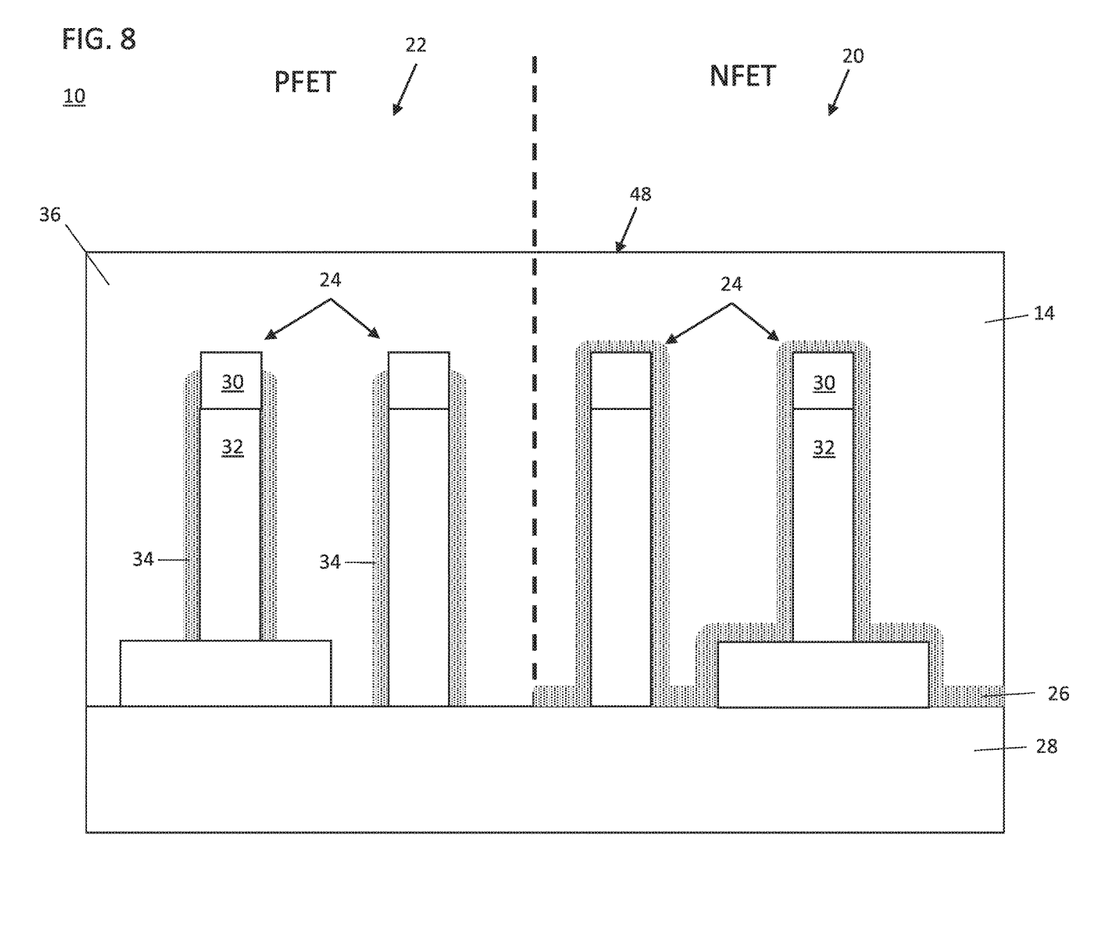
FIG. 8 is a cross-sectional view of the device of FIG. 4 showing the planarization layer and the bottom layer planarized to remove the middle layer of the NFET region in accordance with another embodiment of the present invention.

Referring to FIG. 8, a planarization process on the structure of FIG. 5, such as chemical mechanical polishing (CMP) is performed to remove a portion of the planarization layer 36 and the middle layer 16 in the NFET region 20. A surface 48 extends across the NFET region 20 on bottom layer 14 and across the PFET region 22 on planarization layer 36.

In one embodiment, the materials for the bottom layer 14 and the planarization layer 36 are the same. In other embodiments, the materials for the bottom layer 14 and the planarization layer 36 are different. In one embodiment, the materials of the bottom layer 14 and the planarization layer 36 can be selected to provide a desired amount of protection to regions 20 and 22. For example, one of the bottom layer 14 or the planarization layer 36 may be completely removed before the other based upon the materials of the layers 14 and 36.

Figure 9:
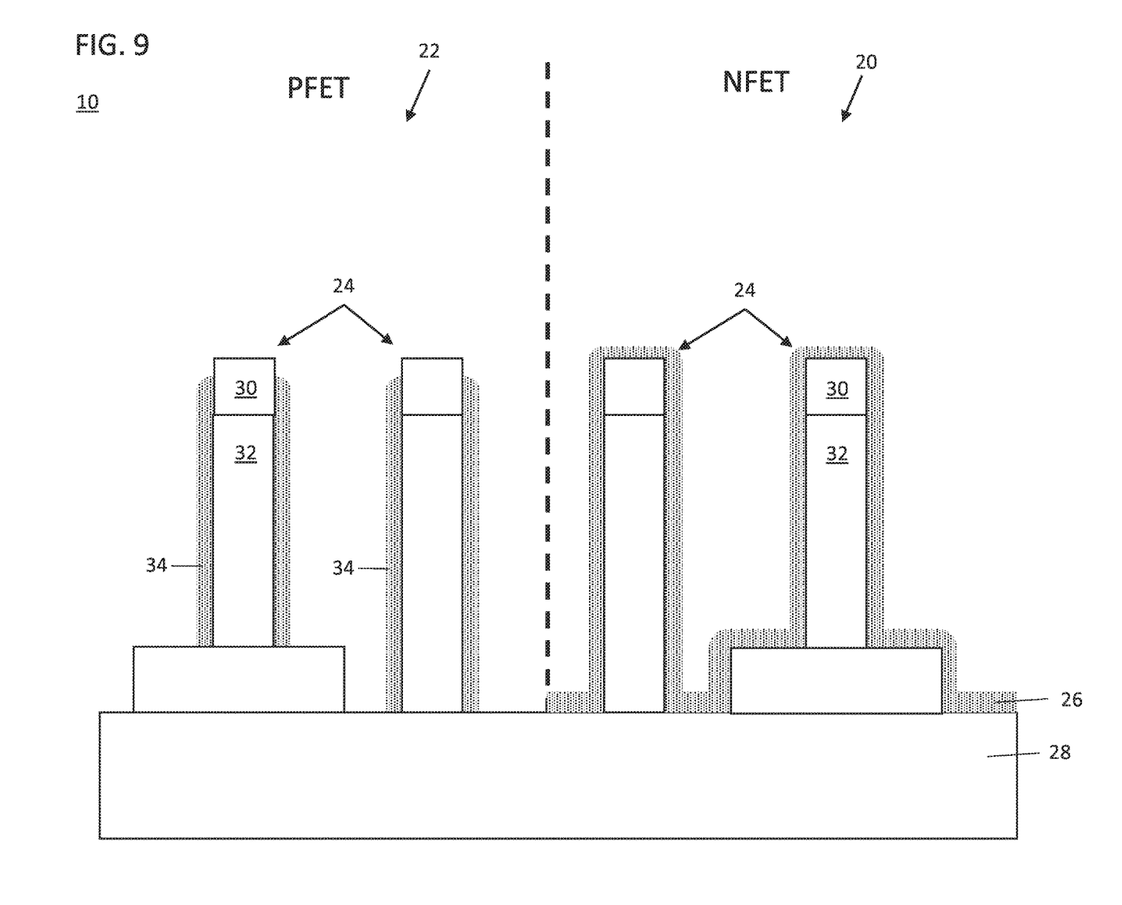
FIG. 9 is a cross-sectional view of the device of FIG. 8 showing the planarization layer and the bottom layer stripped to expose the underlying structures in accordance with an embodiment of the present invention.

Referring to FIG. 9, the bottom layer 14 of the NFET region 20 and the planarization layer 36 in the PFET region 22 are stripped to expose the underlying structures 24. The underlying structures (e.g. structures 24, STI region 28, etc.) remain intact and virtually undamaged as a result of the use of the planarization layer 36 and processing sequence. Processing can continue with PFET source/drain epitaxial growth, deposition of a cap layer and then continue with patterning for blocking the PFET region 22 and performing a spacer etch in the NFET region 20 to grow an NFET source/drain epitaxy layer.

It should be understood that the NFET and the PFET regions described may be reversed and processed in a similar manner. In other embodiments, the alternatively processed regions may include regions other than NFET and PFET regions.

Aspects or the present invention address middle inorganic layer removal processes that can damage underlying structures. The examples described in a trilayer patterning example for dual source drain spacer formation for CMOS devices is non-limiting. The present invention can apply to any patterning structure which can cause potential damage to underlying structures during middle inorganic layer removal processes.

Figure 10:
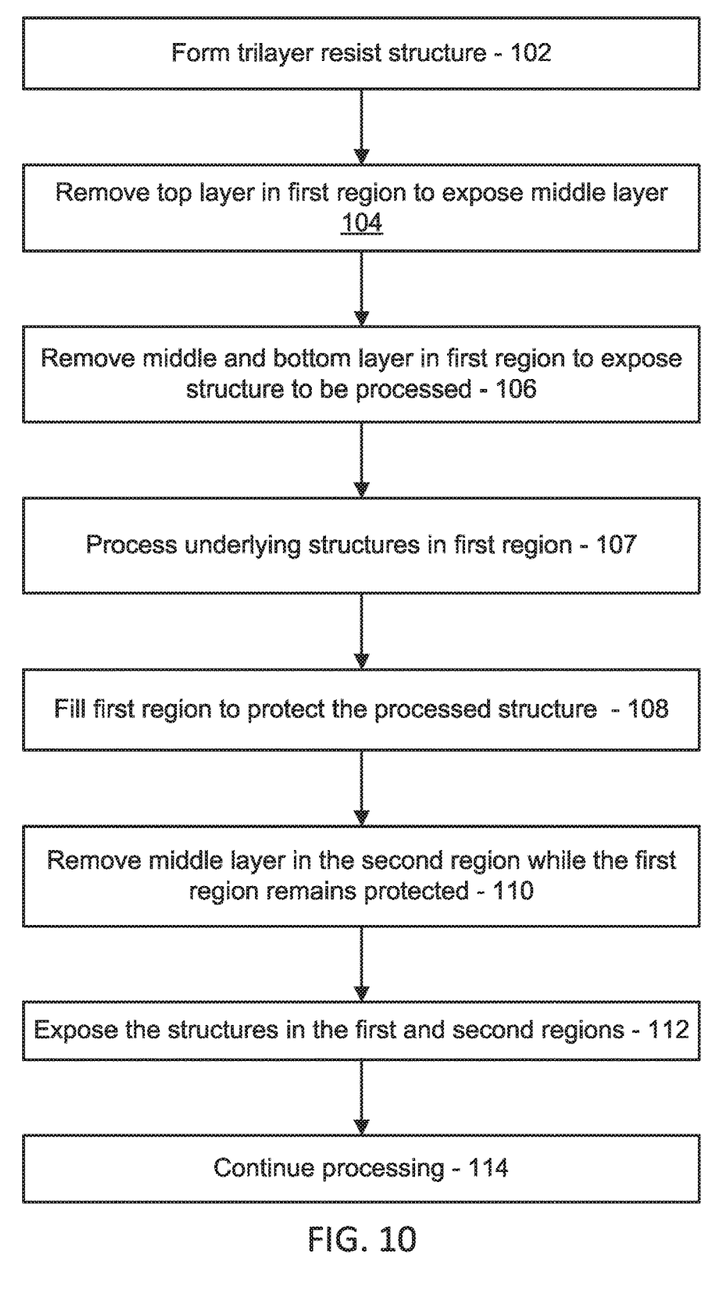
FIG. 10 is a block/flow diagram showing methods for forming a semiconductor device in accordance with embodiments of the present invention.

Referring to FIG. 10, methods for semiconductor processing are illustratively shown and described. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a trilayer resist structure is formed having a middle layer disposed between a top layer and a bottom layer. The trilayer resist structure can be formed by spun-on resist materials or deposited materials depending on the materials selected. The trilayer resist structure can include an organic layer, inorganic layer and organic layer, respectively, for the top layer, the middle layer and the bottom layer. In one embodiment, the middle layer is resistant to etchants employed to etch the top layer and/or the bottom layer. The middle layer can include an anti-reflection coating. The trilayer resist structure is provided to protect or pattern underlying structures, such as, e.g., a semiconductor substrate or device.

In block 104, the top layer is removed from a first region to expose the middle layer in the first region. The top layer can be removed by blocking the second region and etching (e.g., selectively) the top layer in the first region. The first region can include any designated region that needs protection or different processing, e.g., NFET or PFET regions of a CMOS device.

In block 106, the middle layer and the bottom layer in the first region are removed to expose a structure to be subsequently processed (e.g., spacer RIE in one example). The middle layer can be selectively etched with respect to the bottom layer, then the bottom layer may be removed. The second region is protected by the middle layer and/or the blocking layer (during the subsequent processing in the first region). The top layer in a second region is also removed down to the middle layer with the removal of the bottom layer in the first region. The first region is opened to permit additional processing in block 107, such as, e.g., etching of spacers in the first region, e.g., PFET spacer RIE process.

In block 108, the first region is filled to protect the structure that has been processed, e.g., protect the first region. This can include forming a planarization layer over the device. In block 110, the middle layer is removed in the second region while the first region remains protected. This can be performed by etching away the middle layer selective to the planarization layer or by polishing (e.g., CMP) until the middle layer is removed.

In block 112, the structures protected in the first region and in the second region are exposed. This can be performed by a planarization layer/bottom layer strip process (e.g., an etch process). The bottom layer and the planarization layer can include a same material (e.g., OPL). The protected structures remain intact without undue damage that could otherwise result during the removal of the middle layer or other structures. In block 114, processing continues with the further processing or formation of underlying structures, e.g., field effect transistors, metal lines or structures, etc.

Having described preferred embodiments for removal of trilayer resist without damage to underlying structure (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for semiconductor processing, comprising:
  forming a trilayer photoresist structure having a middle layer disposed between a top layer and a bottom layer in first and second regions of a semiconductor device;
  removing the top layer from the first region to expose the middle layer in the first region;
  removing the middle layer and the bottom layer in the first region to expose at least one first structure in the first region, the top layer in the second region being removed during the removal of the bottom layer in the first region;
  filling the first region to protect the at least one first structure;
  removing the middle layer in the second region while the at least one first structure remains protected; and
  exposing the at least one first structure and at least one second structure in the second region.

2. The method as recited in claim 1, wherein the trilayer photoresist structure includes an organic layer, inorganic layer and organic layer, respectively, for the top layer, the middle layer and the bottom layer.

3. The method as recited in claim 1, wherein the middle layer is resistant to etchants employed to etch the top layer and the bottom layer.

4. The method as recited in claim 1, wherein filling the first region includes depositing a planarization layer.

5. The method as recited in claim 4, wherein the bottom layer and the planarization layer include a same material.

6. The method as recited in claim 4, wherein the bottom layer and the planarization layer include an organic planarization layer (OPL).

7. The method as recited in claim 1, wherein the middle layer includes an anti-reflection coating.

8. The method as recited in claim 1, wherein removing the middle layer in the second region while the first region remains protected includes polishing the middle layer away.

9. The method as recited in claim 1, wherein removing the middle layer in the second region while the first region remains protected includes selectively etching the middle layer away.

10. A method for semiconductor processing, comprising:
  forming a trilayer photoresist structure having a middle layer disposed between a top layer and a bottom layer in first and second regions of a semiconductor device;
  removing the top layer from the first region to expose the middle layer in the first region;
  removing the middle layer and the bottom layer in the first region to expose at least one first structure in the first region, the top layer in the second region being removed during the removal of the bottom layer in the first region;
  processing the at least one first structure;
  forming a planarization layer over the middle layer in the second region and the at least one first structure in the first region;
  removing the planarization layer in the second region, and removing the planarization layer in the first region down to a position located between the middle layer in the second region and the at least one first structure;
  removing the middle layer in the second region by performing a selective etch process while the at least one first structure remains protected by the planarization layer in the first region; and
  stripping the planarization layer in the first region and the bottom layer in the second region to expose the at least one first structure and at least one second structure in the second region.

11. The method as recited in claim 10, wherein the trilayer photoresist structure includes an organic layer, inorganic layer and organic layer, respectively, for the top layer, the middle layer and the bottom layer.

12. The method as recited in claim 10, wherein the middle layer is resistant to etchants employed to etch the top layer and the bottom layer.

13. The method as recited in claim 10, wherein processing the at least one first structure includes performing a spacer etch.

14. The method as recited in claim 10, wherein the bottom layer and the planarization layer include a same material.

15. The method as recited in claim 10, wherein the bottom layer and the planarization layer include an organic planarization layer (OPL).

16. The method as recited in claim 10, wherein the middle layer includes an anti-reflection coating.

17. A method for semiconductor processing, comprising:
  forming a trilayer photoresist structure having a middle layer disposed between a top layer and a bottom layer in first and second regions of a semiconductor device;
  removing the top layer from the first region to expose the middle layer in the first region;
  removing the middle layer and the bottom layer in the first region to expose at least one first structure in the first region, the top layer in the second region being removed during the removal of the bottom layer in the first region;
  processing the at least one first structure;
  forming a planarization layer over the middle layer in the second region and the at least one first structure in the first region;

removing the planarization layer in the second region, and removing the planarization layer in the first region down to a position located between the middle layer in the second region and the at least one first structure;

removing the middle layer in the second region by performing a polishing process while the first region remains protected by the planarization layer in the first region; and stripping the planarization layer in the first region and the bottom layer in the second region to expose the at least one first structure and at least one second structure in the second region.

18. The method as recited in claim 17, wherein the trilayer photoresist structure includes an organic layer, inorganic layer and organic layer, respectively, for the top layer, the middle layer and the bottom layer.

19. The method as recited in claim 17, wherein the middle layer is resistant to etchants employed to etch the top layer and the bottom layer.

20. The method as recited in claim 17, wherein the bottom layer and the planarization layer include a same material.

\* \* \* \* \*